(12) United States Patent
Paulus

(10) Patent No.: US 6,639,456 B2
(45) Date of Patent: Oct. 28, 2003

(54) CURRENT MIRROR AND METHOD FOR OPERATING A CURRENT MIRROR

(75) Inventor: Christian Paulus, Weihlheim (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/288,386

(22) Filed: Nov. 5, 2002

(65) Prior Publication Data

US 2003/0071678 A1 Apr. 17, 2003

Related U.S. Application Data

(63) Continuation of application No. PCT/DE01/01664, filed on May 4, 2001.

(30) Foreign Application Priority Data

May 5, 2000 (DE) .......................... 100 21 928

(51) Int. Cl.$^7$ ................................ G05F 1/10
(52) U.S. Cl. ................ 327/545; 327/543; 323/315
(58) Field of Search .................... 327/538, 539, 327/540, 541, 543, 545, 546; 323/312, 313, 314, 315

(56) References Cited

U.S. PATENT DOCUMENTS

| | | | | |
|---|---|---|---|---|
| 4,667,180 A | * | 5/1987 | Robinson | 341/135 |
| 4,673,830 A | * | 6/1987 | Giorgetta et al. | 327/542 |
| 5,498,953 A | * | 3/1996 | Ryat | 323/315 |
| 5,521,544 A | * | 5/1996 | Hatanaka | 327/356 |
| 5,672,993 A | * | 9/1997 | Runaldue | 327/404 |
| 5,894,245 A | | 4/1999 | Cho | |
| 5,949,278 A | * | 9/1999 | Oguey | 327/543 |
| 6,528,980 B1 | * | 3/2003 | Smith | 323/315 |

FOREIGN PATENT DOCUMENTS

| | | |
|---|---|---|
| EP | 0412566 A2 | 2/1991 |
| EP | 0651502 B1 | 5/1995 |
| EP | 0690561 B1 | 1/1996 |

OTHER PUBLICATIONS

Tietze, U. et al.: "Halbleiter–Schaltungstechnik", 10th Edition, Springer Verlag, pp. 62–64 and 66 to 70, pertains to Transistors as Constant Current Source.

Laker, K. R. et al.: "Design of Analog Integrated Circuits and Systems", McGraw–Hill, New York, pp. 456–462.

Jonsson, B.: "Switched–Current Circuits: from Building Blocks to Mixed Analog–Digital Systems", Department of Electronics, Stockholm 1999, pp. 31, 39 and 40.

Lu, G. N. et al. "A CMOS Op Amp Using a Regulated–cascode Transimpedance Building Block for High–gain, Low–voltage Achievement", IEEE International Symposium on Circuits and Systems, Jun. 9–12, 1997, Hong Kong, pp. 165–168.

* cited by examiner

*Primary Examiner*—Terry D. Cunningham
(74) *Attorney, Agent, or Firm*—Laurence A. Greenberg; Werner H. Stemer; Gregory L. Mayback

(57) ABSTRACT

A current mirror and method for operating such a mirror include nonlinearly converting an input current ($I_{in}^+=I_0$ and, respectively, $I_{in}^-=I_0$) into a voltage in a current sink, the voltage being used for driving a current source ($I_{out}^+=-n \cdot I_0$ and, respectively, $I_{out}^-=n \cdot I_0$) with substantially the same transfer characteristic. According to the invention, the current mirror is configured to contain a further voltage-controlled current source that supplies an auxiliary current $a \cdot I_{out}=-a \cdot n \cdot I_0$.

20 Claims, 5 Drawing Sheets

US 6,639,456 B2

CURRENT MIRROR AND METHOD FOR OPERATING A CURRENT MIRROR

CROSS-REFERENCE TO RELATED APPLICATION

This application is a continuation of copending International Application No. PCT/DE01/01664, filed May 4, 2001, which designated the United States and was not published in English.

BACKGROUND OF THE INVENTION

Field of the Invention

The invention relates to a current mirror in which an input current ($I_{in}$) is nonlinearly converted into a voltage in a current sink, the voltage being used for driving a current source ($I_{out}$) having substantially the same transfer characteristic.

The invention also relates to a method for operating a current mirror.

Current mirrors are circuits or circuit components that, as a response to a current, generate a current of the same intensity.

The prior art uses current mirrors, in particular, in integrated circuits in which data are processed based upon current signals.

A current mirror is, preferably, a circuit or a part of a circuit. It converts an input current into an output current. Preferably, there is a linear relationship between the input current and the output current.

Existing in the prior art is the use of suitably connected transistors as a current sink or as a current source.

Various circuit configurations for current mirrors are described in the book by C. Toumazou, F. J. Lidgey, and D. G. Haigh: "Analogue IC design: the current mode approach", London 1990.

It is particularly in highly accurate integrated analog circuits that differential signal processing is normally used for reducing the sensitivity of the circuits to interfering influences of the most varied type. While such is achieved by using fully differential operational amplifiers (high CMRR, PSRR, etc.) in circuits that transmit information in the voltage domain, current-mode circuits must use other solutions. In these circuits, quasi-differential current signal processing is frequently used in which two identical but electrically separate circuits are used in parallel. Due to the lack of direct electrical coupling and the possibly large spatial separation of the two signal paths on the chip, the advantages of differential signal processing become relative.

Other prior art embodiments are, in most cases, based upon using differential stages that result in disadvantages with respect to component mismatch and speed and output voltage range of the current mirror.

SUMMARY OF THE INVENTION

It is accordingly an object of the invention to provide a current mirror and method for operating a current mirror that overcome the hereinafore-mentioned disadvantages of the heretofore-known devices and methods of this general type and that creates a current mirror that has the highest possible stability, particularly with respect to common-mode signals.

With the foregoing and other objects in view, there is provided, in accordance with the invention, a method for operating a differential current mirror circuit, including the steps of generating, with devices, at least one copy of a respective one of a positive input current and a negative input current by respectively converting the respective one of the positive input current and the negative input current into a respective voltage, utilizing a respective voltage for respectively driving one current source to generate a copy of a respective one of a positive output current and a negative output current, generating, with a device, one auxiliary current that is one of a multiple and a fraction of each respective one of the positive input current and the negative input current, extracting, with a device, an interference signal by adding the two auxiliary currents, and providing one device each to generate the positive output current and the negative output current by subtracting the interference signal from a respective one of a copy of the positive input current and a copy of the negative input current.

With the objects of the invention in view, there is also provided a method for operating a differential current mirror circuit, including the steps of generating, with first devices, at least one copy of a respective one of a positive input current and a negative input current by respectively converting the respective one of the positive input current and the negative input current into a respective voltage, generating, with a second device, one auxiliary current that is one of a multiple and a fraction of each respective one of the positive input current and the negative input current, extracting, with a third device, an interference signal by adding the two auxiliary currents, and utilizing a respective voltage for respectively driving one current source to generate a copy of a respective one of a positive output current and a negative output current by providing one device each to generate the positive output current and the negative output current by subtracting the interference signal from a respective one of a copy of the positive input current and a copy of the negative input current.

In accordance with another mode of the invention, there is provided the step of generating the two auxiliary currents as one half of the respective one of the positive input current and the negative input current.

In accordance with a further mode of the invention, the device for generating the positive output current and the negative output current has at least one complementary current mirror.

In accordance with an added mode of the invention, there is provided the step of generating a multiple of the copy of the respective one of the positive input current and the negative input current respectively as the positive output current and as the negative output current.

In accordance with an additional mode of the invention, there is provided the step of generating a number of copies of the respective one of the positive input current and the negative input current.

With the objects of the invention in view, there is also provided a differential current mirror circuit, including devices generating at least one copy each of a respective one of a positive input current and a negative input current by respectively converting the respective one of the positive input current and the negative input current into a respective voltage, a respective current source connected to the devices, the respective voltage driving each current source to generate a copy of a respective one of a positive output current and a negative output current, a device connected to a respective one of the current sources and to the devices and respectively generating one auxiliary current that is one of a multiple and a fraction of the respective one of the positive input current and the negative input current, a device connected to a respective one of the current sources and to the devices and extracting an interference signal by adding the two auxiliary currents, and devices each generating the positive output current and the negative output current by subtracting the interference signal from a respective one of a copy of the positive input current and the negative input current.

With the objects of the invention in view, there is also provided a differential current mirror circuit, including first means for generating at least one copy each of a respective one of a positive input current and a negative input current by respectively converting the respective one of the positive input current and the negative input current into a respective voltage, a respective current source connected to the devices, the respective voltage driving each current source to generate a copy of a respective one of a positive output current and a negative output current, second means for respectively generating one auxiliary current that is one of a multiple and a fraction of the respective one of the positive input current and the negative input current, the second generating means connected to a respective one of the current sources and to the devices, means for extracting an interference signal by adding the two auxiliary currents, the extracting means connected to a respective one of the current sources and to the first means, and third means for respectively generating the positive output current and the negative output current by subtracting the interference signal from a respective one of a copy of the positive input current and the negative input current.

In accordance with yet another feature of the invention, the device or second means generates the two auxiliary currents as one half of the respective one of the positive input current and the negative input current.

In accordance with yet a further feature of the invention, the device for generating the positive output current and the negative output current or third means has at least one complementary current mirror.

In accordance with yet an added feature of the invention, the devices each generating the positive output current and the negative output current or third means generate a multiple of the copy of the respective one of the positive input current and the negative input current respectively as the positive output current and as the negative output current.

In accordance with yet an additional feature of the invention, the devices or first means generate a number of copies of the respective one of the positive input current and the negative input current.

The invention includes a fully differential symmetric current mirror unit, the two signal paths of which being direct-coupled. Such a configuration results in advantages in the rejection of interference signals.

According to the invention, a "voltage controlled current source" is any component or any module that generates an output current when an input voltage is applied. In the simplest case, this can be an MOS transistor having a voltage applied to the gate thereof, a current being produced at the source-drain terminals. It is also conceivable to use a bipolar transistor. Modules of two transistors, three transistors, or even more complex voltage-controlled current sources are also conceivable.

According to the invention, the current mirror contains another voltage-controlled current source that supplies an auxiliary current ($a \cdot I_{out} = a \cdot n \cdot I_{in}$).

The term "common-mode rejection" is used in conjunction with differential amplifiers or operational amplifiers and relates to their characteristic of rejecting a common mode signal present at the input of the circuit. At the outputs of the circuit, only the differential signal appears that, e.g., is amplified.

The same is meant by common mode rejection in current mirrors. Independently of the common mode component at the inputs of the current mirror circuit, only the differential signal should appear at the output of the current mirror according to the invention.

The parameter a designates the fraction of the output current of the current mirror circuit that is provided as auxiliary current in order to correct for the interference signal in the differential current mirror circuit according to the invention.

In particular, the invention provides for constructing a fully differential current mirror without using differential stages that has advantages with regard to output voltage range, component mismatch and stability or bandwidth of the overall circuit.

The invention includes a symmetric current mirror unit in which an interference signal (common-mode component) of the differential signal is subtracted from the output current by a suitable supplementary circuit.

Current mirrors using MOS transistors are based on the fact that an input current ($I^+_{in} = I_0$ or, respectively, $I^-_{in} = -I_0$) is nonlinearly converted in a current sink into a voltage that is used for driving a current source ($I^+_{out} = -n \cdot I_0$, or, respectively, $I^-_{out} = n \cdot I_0$) having the same transfer characteristic. The current mirror thus formed is, then, extended by another voltage-controlled current source that supplies a current of $a \cdot I_{out}^+ = -a \cdot n \cdot I_0$. Such an auxiliary current is connected to the corresponding auxiliary current source of the identical second differential branch that delivers an output of $a \cdot I_{out}^- = a \cdot n \cdot I_0$. In such a case, the two currents cancel. If there is asymmetry in the input signal (common-mode component), the auxiliary currents will not cancel and the resultant residual current trigger δI can be subtracted from the differential output signals with the aid of another current mirror having a transfer ratio of ½a. This results in mathematically complete common-mode rejection.

It is suitable to configure the current mirror such that an additional voltage-controlled current source in an additional branch generates an additional auxiliary current.

Advantageously, the current mirror is configured such that the auxiliary current and the additional auxiliary current are added such that the result is δI.

In practice, it is advantageous to select:

$$a = \frac{1}{2} \text{ or } a = 1$$

because the entire current mirror can, then, be constructed by using identical n-MOS transistors or, respectively, p-MOS transistors.

Advantages of the circuit are the simple implementation as a supplementary module for existing current mirror units and the general independence of the architecture presented from the basic structure of the current mirror used. Furthermore, there are no stability problems due to the lack of feedback in the circuit so that the circuit is particularly suitable for applications with a wide signal bandwidth.

It is an important advantage of the invention to be able to implement fully differential current mirror structures without using a differential stage (see exemplary embodiment) that has various disadvantages with respect to bandwidth, output voltage range, and sensitivity to component mismatch.

It is appropriate that at least one of the current sources is formed by at least one transistor and/or that at least one of the current sources contains cascaded transistors.

According to the invention, the following distinguishing terms are used. In normal signal processing in circuits, the information to be processed is represented by an electrical signal (generally a voltage). Referred to a reference signal (e.g., ground), the magnitude of this signal is obtained from the difference between the (fixed) reference signal and the signal on the signal line. Such a type of signal processing based on absolute values is generally called "single ended."

In differential (=fully differential) signal processing, in contrast, the information is transmitted on two lines. Line 1 conducts the signal, line 2 conducts the inverted signal. The information represented by the signals is obtained by forming the difference between the two signal lines. The significant advantage of this differential signal processing is the clearly reduced sensitivity to induced interference from adjacent lines or from lines crossing the signal lines. In the "single-ended" method, an interference signal induced in this manner is added to the useful signal and is processed further in the circuit. In differential signal processing, the interference is added on both signal-conducting lines. By forming the difference at the output of the circuit, the interference component of the signal is, thus, eliminated again. The differential architecture is particularly suitable for circuits in which very small signals must be processed or very accurate signal processing must be effected. Further information relating to this subject can be found in: "Design of analog integrated circuits and systems" by Kenneth R. Laker & Willy M. C. Sansen, McGraw-Hill publishers, ISBN 0-07-036060-X, page 456ff.).

In this context, the term "quasi-differential current mirror" designates a current mirror circuit in which two signal paths are provided for the signal and the inverted signal but interference is not eliminated within the circuit. Thus, the interference is forwarded to the stage following the current mirror and can lead to an impairment of the signal (e.g., due to saturation effects) there, or in a later stage in the signal processing chain.

The terms "differential," "fully differential," and "fully differential symmetric current mirror" designate the same circuit architecture. A current mirror circuit is constructed here that has two signal paths—for the noninverted signal stream and the inverted signal stream. Furthermore, the common-mode component (=interference signal) is cancelled within the circuit so that only the useful signal is present at the output of the current mirror.

The term "differential signal processing" can be found in "Design of analog integrated circuits and systems" by Kenneth R. Laker & Willy M. C. Sansen, McGraw-Hill publishers, ISBN 0-07-036060-X, page 456ff.). The term "quasi-differential" is frequently used by the applicant in connection with this subject.

If the device for generating the positive output current ($I_{out}+$) and the negative output current ($I_{out}-$) by subtracting the interference signal ($I_{cor}$) from a copy of the positive input current ($I_{in}+$) or, respectively, from a copy of the negative input current ($I_{in}-$) has at least one complementary current mirror (M11, M14; M12, M15; M13, M16), then both positive and negative interference signals can be subtracted.

Other features that are considered as characteristic for the invention are set forth in the appended claims.

Although the invention is illustrated and described herein as embodied in a current mirror and method for operating a current mirror, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
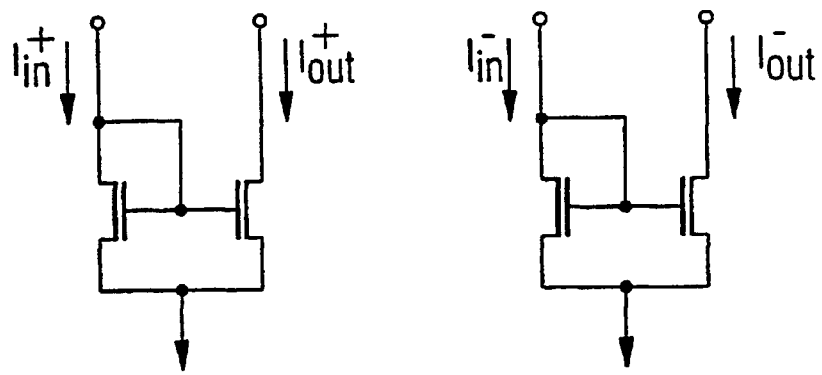
FIG. 1 is a schematic circuit diagram of a quasi-differential current mirror.

Referring now to the figures of the drawings in detail and first, particularly to FIG. 1 thereof, there is shown a quasi-differential current mirror, which makes it possible to form a differential signal between various circuit components.

Figure 2:
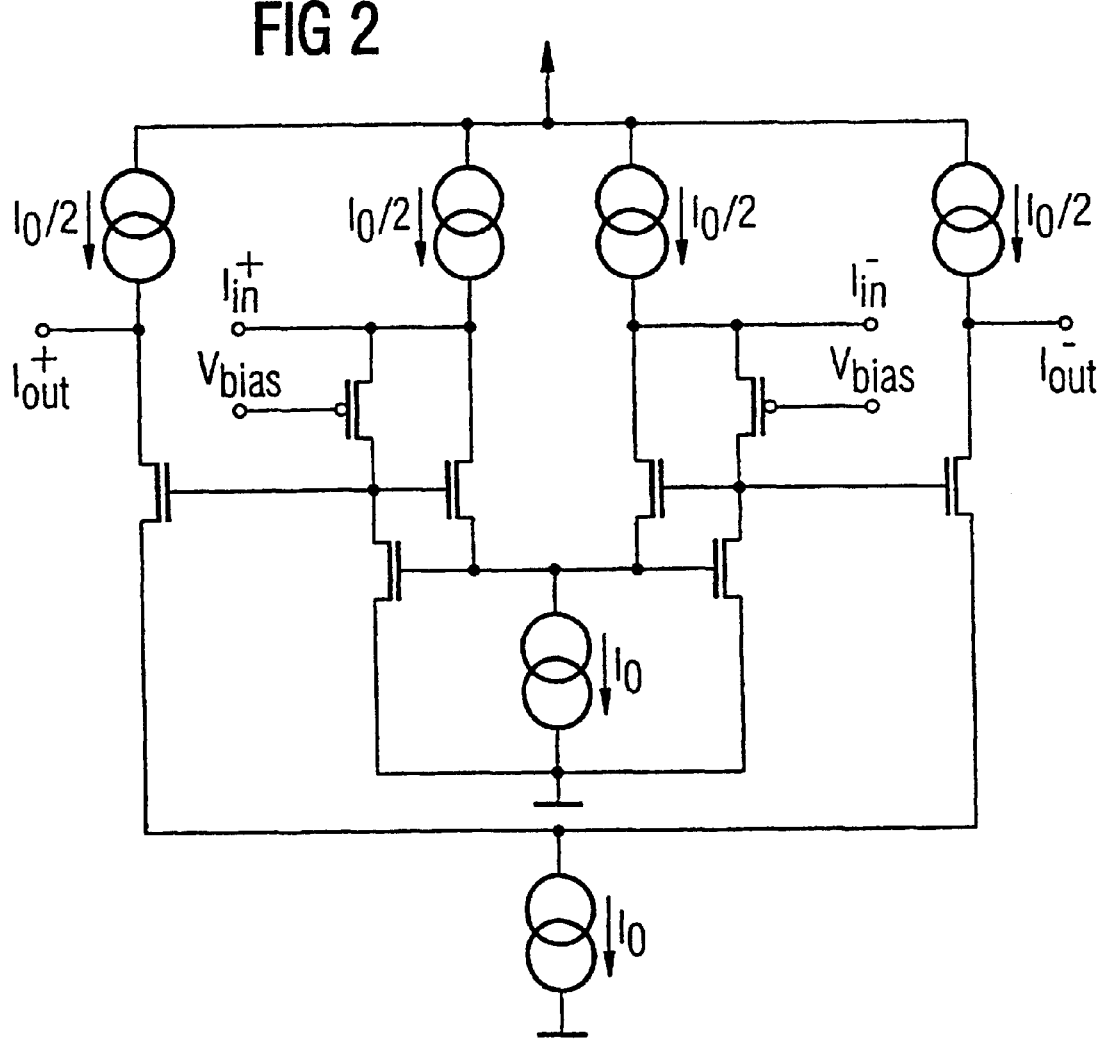
FIG. 2 is a schematic circuit diagram of a fully differential current mirror based on a differential stage.

FIG. 2 shows a possibility of how a fully differential current mirror can be constructed by using a differential stage. Such a current mirror is described, for example, from Bengt Jonsson, "Switched-Current Circuits: from Building Blocks to Mixed Analog-Digital Systems." lecture in the Department of Electronics, Electronic System Design, Electrum 229, Isafjordsgatan 22–26, S-164 40 Kista, Sweden on Jan. 25, 1999. The following text illustrates particular problems in such a current mirror circuit. This circuit is particularly complex with respect to construction. Wideband applications in which high-frequency currents must be balanced present problems in this circuit because the current balancing is not fast enough or accurate enough.

Figure 3:
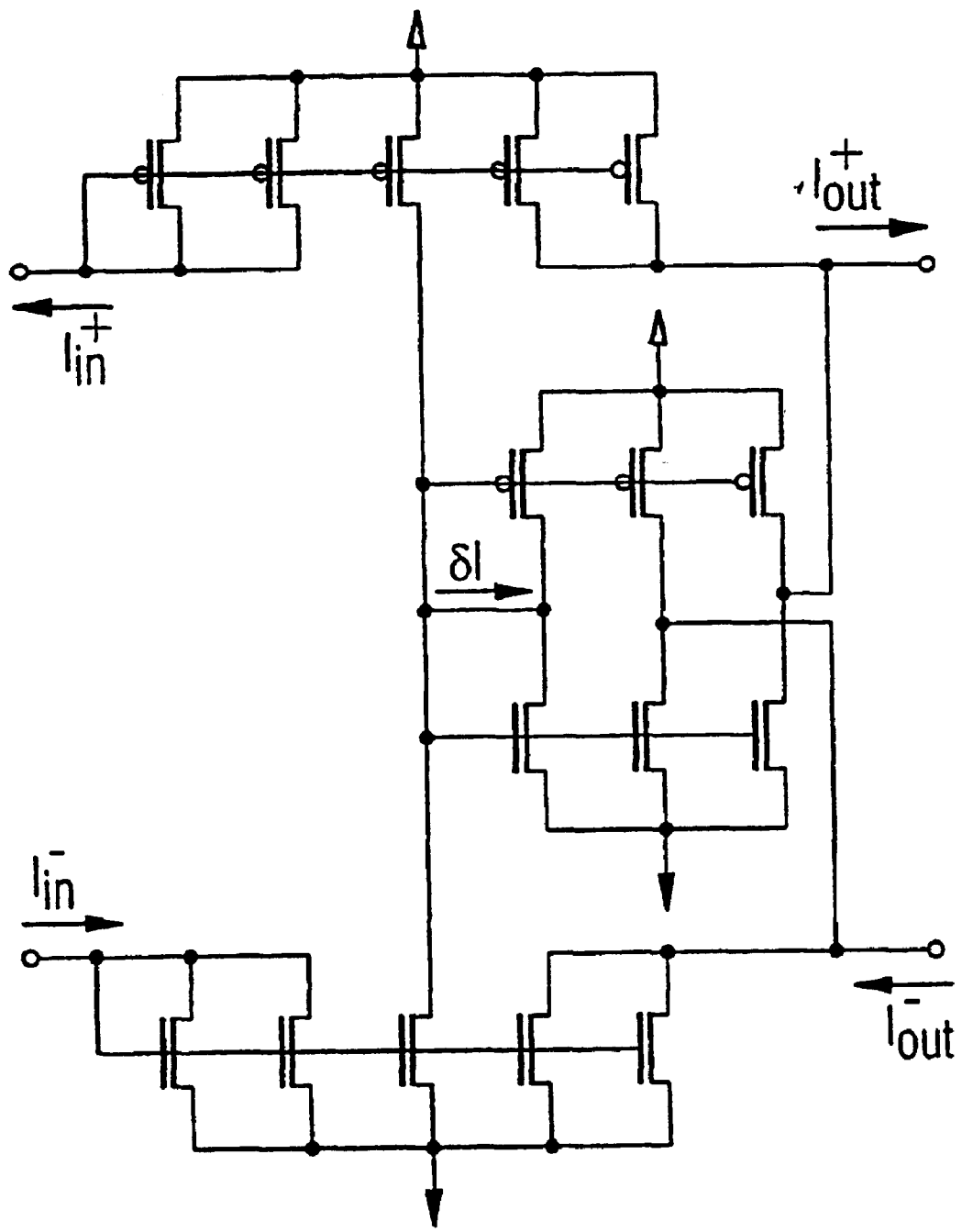
FIG. 3 is a schematic circuit diagram of a generalized basic circuit diagram of a fully differential current mirror according to the invention.

FIG. 3 shows a basic circuit diagram of a fully differential current mirror according to the invention, using MOS transistors as current sources and sinks.

The figure shows a configuration with a=½ because all transistors used here are assumed to be identical. Replacing the simple transistors with cascaded current sources improves the linearity of the circuit.

Figure 4:
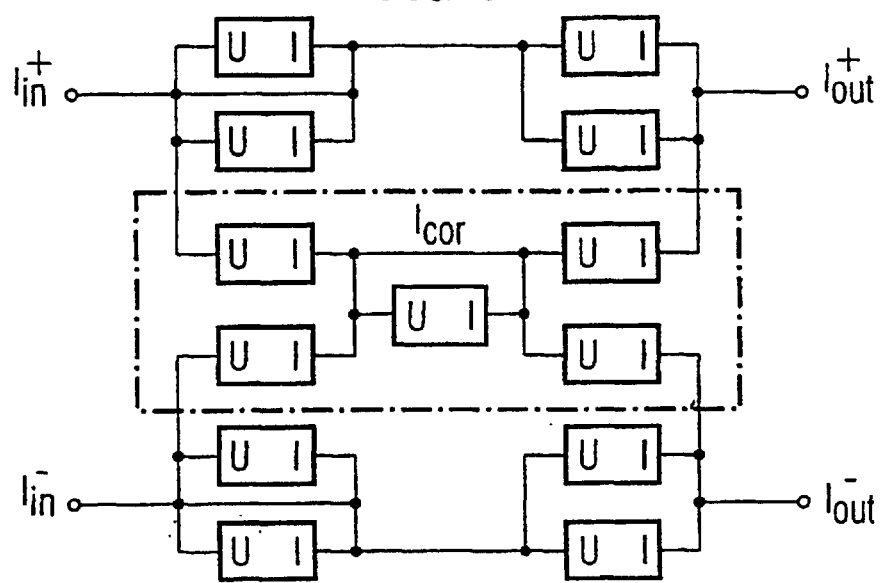
FIG. 4 is a schematic circuit diagram of an exemplary embodiment of a fully differential current mirror according to the invention.

FIG. 4 shows a preferred architecture for fully differential current mirrors. FIG. 4 shows a diagrammatic representation illustrating the basic principle of the current mirror circuit according to the invention. FIG. 4 shows a number of voltage/current converters "U I". The voltage/current converters "U I" are in each case shown as a black box with one input and one output. The input is provided in the corresponding symbol at the location of the symbol "U." The respective output is provided at the location of the symbol "I." In the simplest case, such a "U I" converter can be constructed as a transistor. In CMOS technology, the "U I" converter is represented by a transistor, the input "U" being provided at the so-called "gate" of the relevant transistor. The output is, then, provided by the two channel terminals of the relevant transistor.

In the text that follows, only the symbol of a voltage-controlled current source—U I—is used for explaining the architecture. Assuming that all voltage-controlled current sources are identical, the following relationships are obtained for the signal streams in the circuit:

$$I_{in}{}^+ = I_0 + \delta I;$$

$$I_{in}{}^- = -I_0 + \delta I;$$

and $$I_{cor} = \frac{1}{2} I_{in}{}^+ + \frac{1}{2} I_{in}{}^- = \delta I,$$

where $I_0$ represents the signal current and $\delta I$ represents the interference quantity (common-mode component) that is subtracted again from the output signal by the circuit architecture.

The differential current mirror circuit according to the invention as shown in FIG. 4 has two terminals for the differential input signal ($I_{in}{}^+$ and, respectively, $I_{in}{}^-$) and two terminals for the output signal ($I_{out}{}^+$ and, respectively, $I_{out}{}^-$). Having in mind undisturbed differential signal processing, the current $I_{in}{}^+ = I_0$ is applied to one input of the circuit and the inverse current $I_{in}{}^- = -I_0$ is applied to the second input. To illustrate, this means that a current is impressed in one terminal (positive sign) and a current is taken from the other terminal (negative sign). The input current $I_{in}{}^+ = I_0$ is converted (nonlinearly) by the MOS transistors M1 and M2, connected as current sink into a voltage that, at the same time, forms the gate potential of transistors M3, M4, and M5. The integrated MOS transistors M1 to M5 have the same physical or geometric characteristics (width/length) and, thus, have the same electrical characteristics within manufacturing tolerances. For this reason, a precise copy of the input current is provided at the output $I_{out}{}^+ : I_{out}{}^+ = -I_0$ (current mirror function). Analogously, an output current $I_{out}{}^- = I_0$ appears at the output of the signal branch for the inverted signal current (transistors M6 to M10). Transistors M3 and M8 also represent current sources in each case and, in this embodiment, in each case provide one half of the respective input current as auxiliary current $I_{aux}{}^+ = -\frac{1}{2}I_{in}{}^+$ or, respectively, $I_{aux}{}^- = \frac{1}{2}I_{in}{}^-$. Adding the two auxiliary currents provides the correction current $\delta I$. The conventional current mirror circuit including MOS transistors M11 to M16 produces two copies of this correction current that are in each case added to the output currents $I_{out}{}^+$ and, respectively, $I_{out}{}^-$. If the input signal is free of interference, the two auxiliary currents cancel one another exactly ($\delta I = I_{aux}{}^+ + I_{aux}{}^- = -\frac{1}{2}I_{in}{}^+ - \frac{1}{2}I_{in}{}^- = -\frac{1}{2}I_0 + \frac{1}{2}I_0 = 0$) and the correction circuit does not provide a correction signal.

If, in contrast, interference signals $I_{dis}$ induced identically on both lines are present at the input of the current mirror circuit according to the invention in addition to the differential input signal ($I_{in}{}^+ = I_O + I_{dis}$ and, respectively, $I_{in}{}^- = -I_O + I_{dis}$), a correction current $\delta I = I_{aux}{}^+ + I_{aux}{}^- = -\frac{1}{2}I_{in}{}^+ - \frac{1}{2}I_{in}{}^- = -\frac{1}{2}I_O + \frac{1}{2}I_{dis} + \frac{1}{2}I_O + \frac{1}{2}I_{dis} = I_{dis}$ results in the circuit according to the invention. Such a correction current is subtracted in each case from the mirrored input current in the two signal branches by the correction circuit: $I_{out}{}^+ = -I_0 - I_{dis} + I_{dis} = -I_0$ and, respectively, $I_{out}{}^- = I_0 + I_{dis} - I_{dis} = I_0$. The output signal provided by the current mirror circuit according to the invention is, thus, the undisturbed input signal that can, then, be processed further by the subsequent circuit blocks.

The operation of the circuit described is independent of the transfer characteristics of the current mirror. In the example described previously (FIG. 4), a balancing ratio of $I_{out}:I_{in}$ of 1:1 was assumed. However, the circuit according to the invention can be configured for any balancing ratios $n=I_{out}:I_{in}$. In such a case, the correction current must also be scaled at the corresponding ratio n to achieve complete elimination of an interference component in the signal. Furthermore, it is not mandatory for the auxiliary current to have half the magnitude of the input current. Rather, an arbitrary fraction or a multiple of the output current can be used for such a purpose. The transfer ratio of the correction current mirror must, then, be correspondingly adapted.

Furthermore, the current mirror circuit according to the invention can also have a number of output stages, for example, to provide a number of copies of the input current. In such a case, the correction circuit must be constructed with further, appropriately scaled correction current mirrors to be able to correct all output currents of the complete circuit.

In FIG. 4, the current sinks and sources are simple MOS transistors. To achieve a better transfer accuracy of the current mirror circuit according to the invention, cascode current sources or active current sources can also be used there. Expressed in general terms, any type of a voltage-controlled current source can be used as current sink or current source in the circuit according to the invention.

In FIG. 4, the areas of the circuit shown there that are outside a so-called correction circuit area correspond to the current mirror circuit of the prior art according to FIG. 1. The correction circuit area is shown in FIG. 4 in a dot-dashed line that only defines an area. This fictitious area boundary has no influence on the operation of the circuit.

A preferred exemplary embodiment with a=½ and, in each case, identical transistors:

M1 to M5;

M6 to M10;

M11 to M13; and

Figure 5:
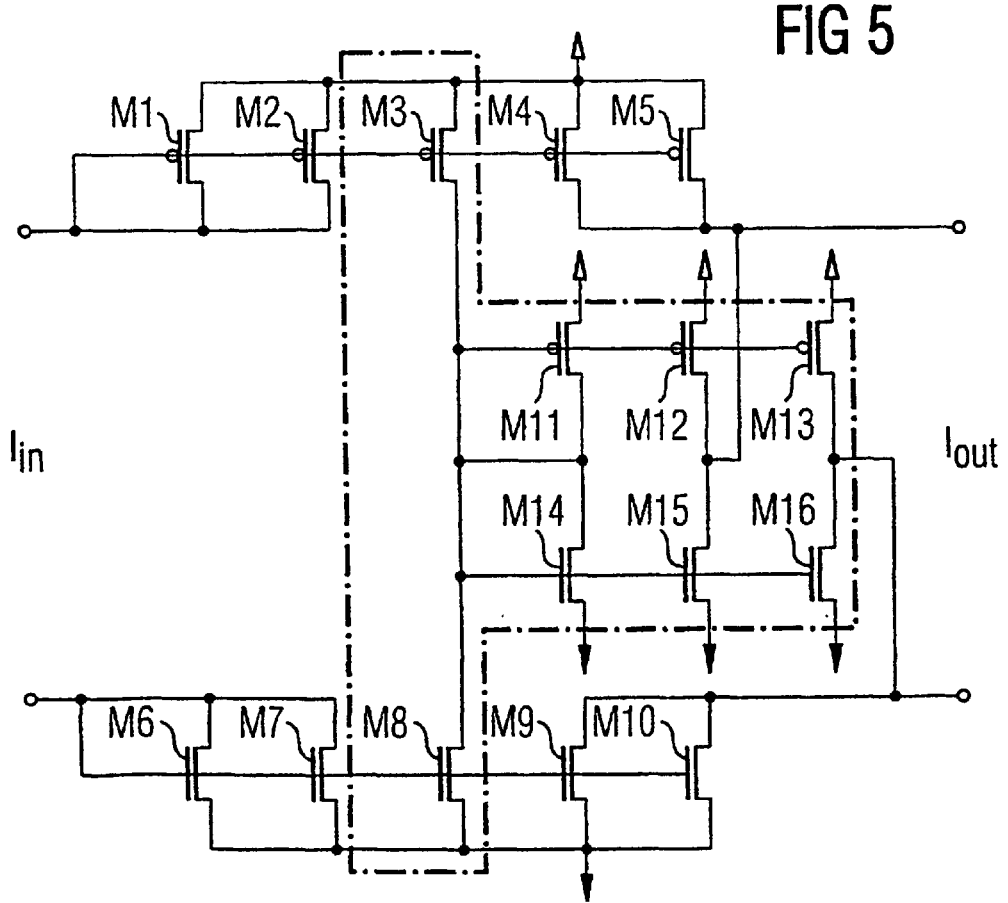
FIG. 5 is a schematic circuit diagram of a circuit configuration for simulating the behavior of the circuit of FIG. 4.

M14 to M16 is shown in FIG. 5.

Figure 6:
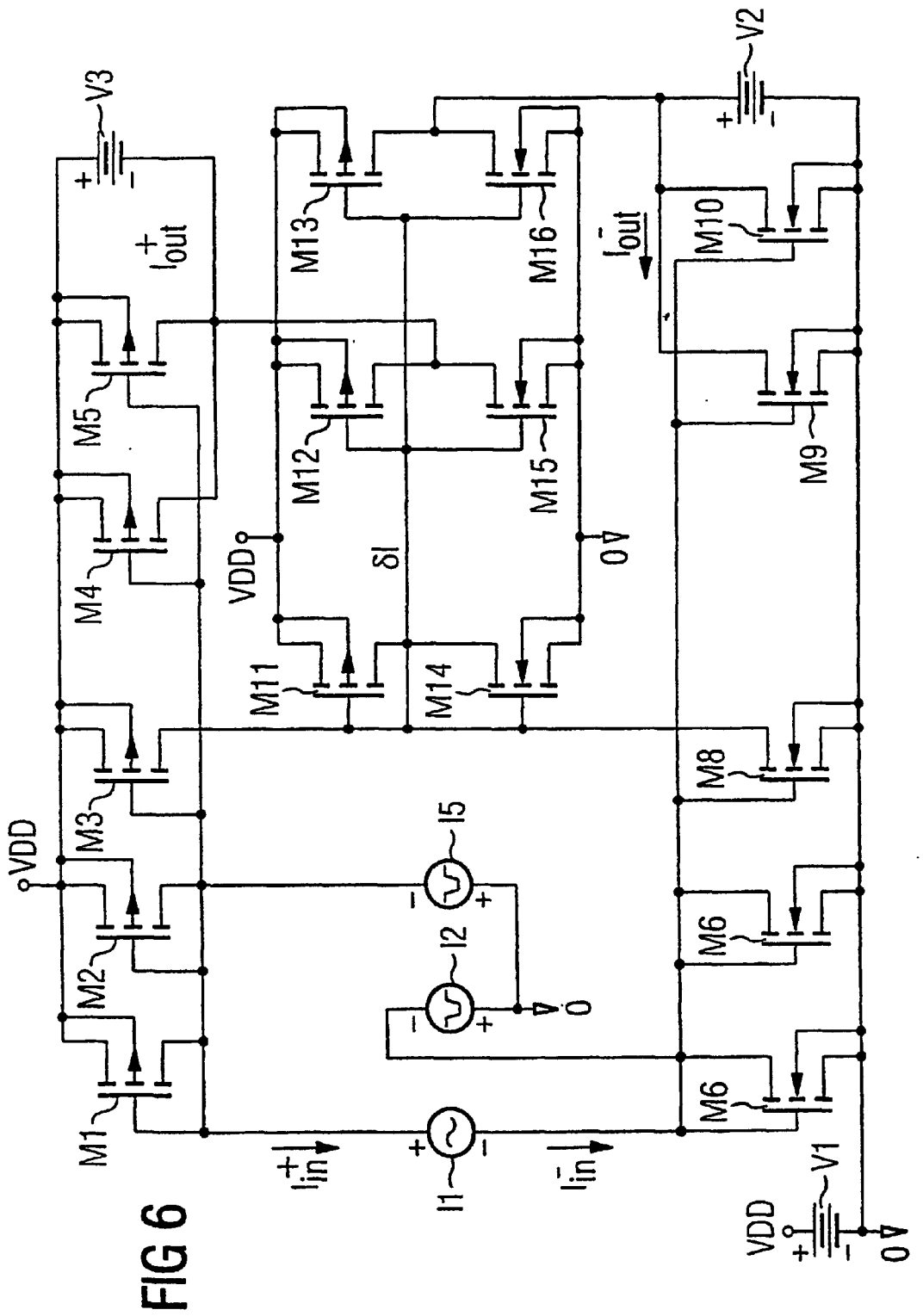
FIG. 6 is a schematic circuit diagram of a configuration for simulating the behavior of a preferred current mirror according to the invention.

FIG. 6 shows a configuration for simulating the behavior of a preferred current mirror.

Figure 7:
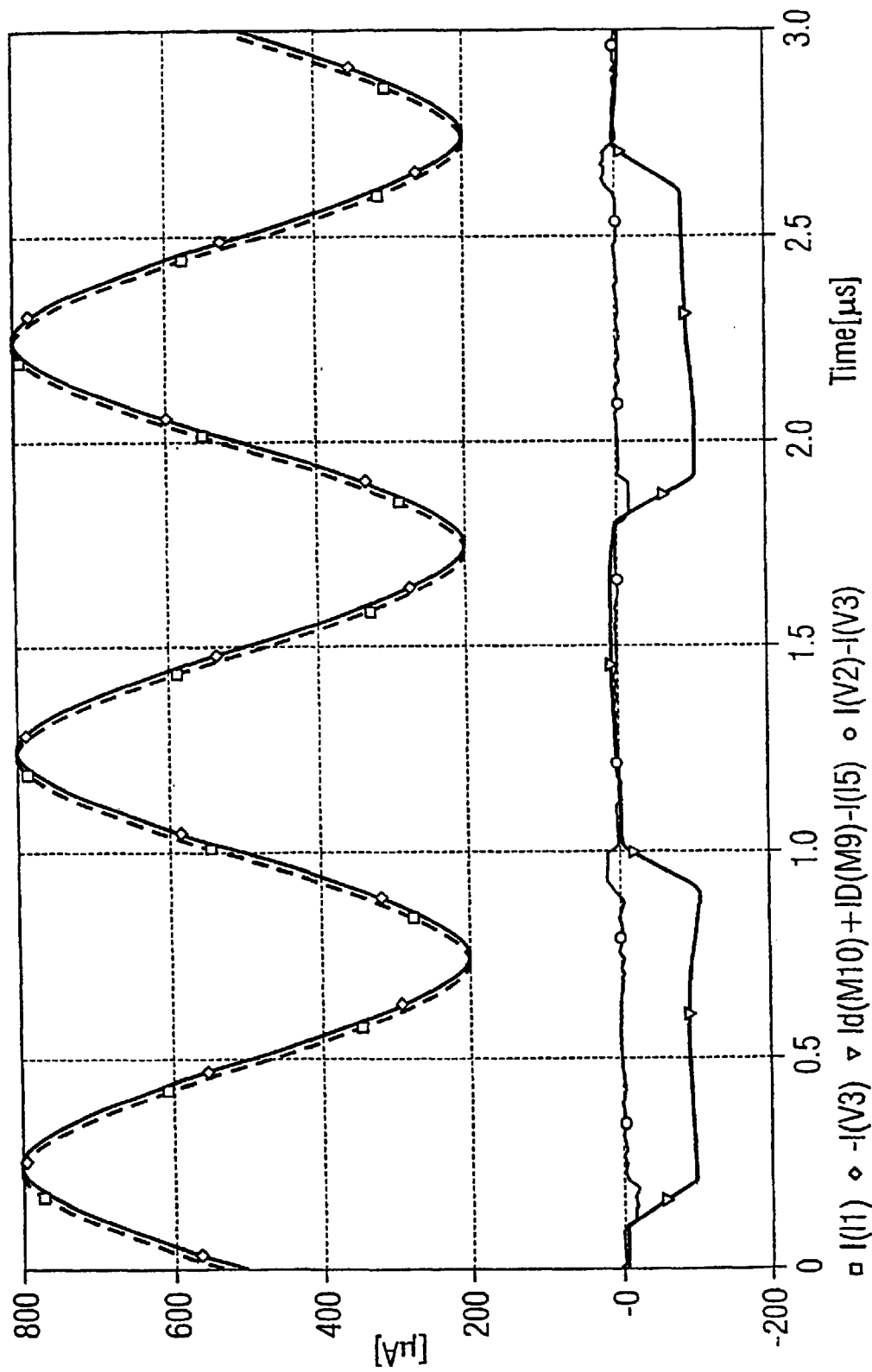
FIG. 7 is a graph illustrating a time-dependence of currents in the circuit of FIG. 5.

FIG. 7 shows a time-dependence of currents in the current mirror.

At the top, the sinusoidal output signal (I(V3)) of the circuit and the sinusoidal input signal (I(I1)) is shown. At the bottom of the diagram, the differential signal of the output currents is shown with and without the common-mode rejection according to the invention. As can be seen from the curve (I(V2)–I(V3)), the rectangular interference (common mode) induced by the pulse sources I2 and I5 (see FIG. 6) is largely rejected by the fully differential circuit.

The embodiment of the invention with CMOS transistors is shown in FIG. 3, in FIG. 5, and in FIG. 6 that in each case reproduce the same circuit.

In addition, the signal sources are also connected to the terminals $I_{in}$ and $I_{out}$ in FIG. 6. In addition, a voltage supply VDD and auxiliary voltage sources V2 and V3 are illustrated to provide a better understanding of the operation of the circuit.

The operation of the current mirror circuit according to the invention can be explained in a simple manner with reference to FIG. 4, the statements made also applying to the embodiments according to FIG. 3, FIG. 5, and FIG. 6.

The invention can also be divided up into the following features:

Current mirror in which an input current ($I_{in}$) is nonlinearly converted into a voltage in a current sink, the voltage being used for driving a current source ($I_{out}$) with substantially the same transfer characteristic, the current mirror containing a further voltage-controlled current source that supplies an auxiliary current ($a \cdot I_{out} = a \cdot n \cdot I_{in}$);

Current mirror as above, an additional voltage-controlled power source in an additional branch generating an additional auxiliary current;

Current mirror as above, the auxiliary current and the additional auxiliary current being added such that a residual current trigger δI results;

Current mirror as above, the resultant residual current being subtracted from the differential output signals with a transfer ratio of 1:2a;

Current mirror as above, where substantially the following applies: a=1:2;

Current mirror as above, where substantially the following applies: a=1;

Current mirror as above, at least one of the current sources being formed by at least one transistor; and Current mirror as above, the current source containing cascaded transistors.

I claim:

1. A method for operating a differential current mirror circuit, which comprises:

converting, with first devices, a positive input current and a negative input current into a respective voltage;

utilizing each respective voltage to drive one current source to generate a copy of a respective one of the positive input current and the negative input current;

generating with at least one second device, one auxiliary current that is one of a multiple and a fraction of each respective one of the positive input current and the negative input current;

extracting, with at least one third device, an interference signal by adding the two auxiliary currents; and providing fourth devices each generating the positive output current and the negative output current by subtracting the interference signal from a respective one of a copy of the positive input current and a copy of the negative input current.

2. The method according to claim 1, which further comprises generating the two auxiliary currents as one half of the respective one of the positive input current and the negative input current.

3. The method according to claim 1, wherein the fourth devices for generating the positive output current and the negative output current have at least one complementary current mirror.

4. The method according to claim 1, which further comprises generating a multiple of the copy of the respective one of the positive input current and the negative input current respectively as the positive output current and as the negative output current.

5. The method according to claim 1, which further comprises generating a number of copies of the respective one of the positive input current and the negative input current.

6. A method for operating a differential current mirror circuit, which comprises:

converting, with first devices, a positive input current and a negative input current into a respective voltage;

generating, with a second device, one auxiliary current that is one of a multiple and a fraction of each respective one of the positive input current and the negative input current;

extracting, with a third device, an interference signal by adding the two auxiliary currents; and utilizing the respective voltage to drive one current source to generate a copy of a respective one of the positive input current and the negative input current by providing fourth devices each generating the positive output current and the negative output current by subtracting the interference signal from a respective one of a copy of the positive input current and a copy of the negative input current.

7. The method according to claim 6, which further comprises generating the two auxiliary currents as one half of the respective one of the positive input current and the negative input current.

8. The method according to claim 6, wherein the fourth devices for generating the positive output current and the negative output current have at least one complementary current mirror.

9. The method according to claim 6, which further comprises generating a multiple of the copy of the respective one of the positive input current and the negative input current respectively as the positive output current and as the negative output current.

10. The method according to claim 6, which further comprises generating a number of copies of the respective one of the positive input current and the negative input current.

11. A differential current mirror circuit, comprising:

first devices responsive to a positive input current and a negative input current for converting the respective one of the positive input current and the negative input current into respective voltages;

a respective current source connected to said first devices, said respective voltages driving each current source to generate a copy of a respective one of the positive input current and the negative input current;

second devices each connected to a respective one of said current sources and to said first devices and respectively generating one auxiliary current that is one of a multiple and a fraction of the respective one of the positive input current and the negative input current;

third devices each connected to a respective one of said current sources and to said second devices and extracting an interference signal by adding the two auxiliary currents; and fourth devices each generating a positive output current and a negative output current by subtracting the interference signal from a respective one of a copy of the positive input current and the negative input current.

12. The differential current mirror circuit according to claim 11, wherein said second devices generate the two auxiliary currents as one half of the respective one of the positive input current and the negative input current.

13. The differential current mirror circuit according to claim 11, wherein said fourth devices have at least one complementary current mirror.

14. The differential current mirror circuit according to claim 11, wherein said fourth devices generate a multiple of the copy of the respective one of the positive input current and the negative input current respectively as the positive output current and as the negative output current.

15. The differential current mirror circuit according to claim 11, wherein said first devices generate a number of copies of the respective one of the positive input current and the negative input current.

16. A differential current mirror circuit, comprising:

first means for converting a positive input current and a negative input current into a respective voltage;

current sources connected to said first means, said respective voltage driving each of said current sources to generate a copy of a respective one of a positive output current and a negative output current;

second means for respectively generating one auxiliary current that is one of a multiple and a fraction of the respective one of the positive input current and the negative input current, said second generating means connected to a respective one of said current sources and to said first means;

third means for extracting an interference signal by adding the two auxiliary currents, said third means connected to a respective one of said current sources and to said first means; and fourth means for respectively generating the positive output current and the negative output current by subtracting the interference signal from a respective one of a copy of the positive input current and the negative input current.

17. The differential current mirror circuit according to claim 16, wherein said second means generates the two auxiliary currents as one half of the respective one of the positive input current and the negative input current.

18. The differential current mirror circuit according to claim 16, wherein said fourth means has at least one complementary current mirror.

19. The differential current mirror circuit according to claim 16, wherein said fourth means generate a multiple of the copy of the respective one of the positive input current and the negative input current respectively as the positive output current and as the negative output current.

20. The differential current mirror circuit according to claim 16, wherein said first means generate a number of copies of the respective one of the positive input current and the negative input current.

* * * * *

UNITED STATES PATENT AND TRADEMARK OFFICE
CERTIFICATE OF CORRECTION

PATENT NO. : 6,639,456 B2
DATED : October 28, 2003
INVENTOR(S) : Christian Paulus It is certified that error appears in the above-identified patent and that said Letters Patent is hereby corrected as shown below:

<u>Title page,</u>
Item [75], should read as follows:
-- Christian Paulus, Weilheim (DE) --

<u>Column 10,</u>
Line 54, should read as follows:
-- auxiliary currents as one half of the respective one of the --

Signed and Sealed this

Sixteenth Day of March, 2004

JON W. DUDAS
*Acting Director of the United States Patent and Trademark Office*